United States Patent
Copel (10) Patent No.: US 6,735,556 B2
(45) Date of Patent: May 11, 2004

(54) REAL-TIME MODEL EVALUATION (75) Inventor: Matthew W. Copel, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 348 days.

(21) Appl. No.: 09/883,065

(22) Filed: Jun. 15, 2001

(65) Prior Publication Data

US 2003/0046041 A1 Mar. 6, 2003

(51) Int. Cl.[7] .............................................. G06F 17/50
(52) U.S. Cl. ............................... 703/2; 703/5; 345/420; 716/20
(58) Field of Search .............................. 703/2, 4, 7, 11, 703/5; 345/420, 781, 809, 970, 676; 716/20

(56) References Cited

U.S. PATENT DOCUMENTS

| | | | | |
|---|---|---|---|---|
| 4,785,399 A | * | 11/1988 | Evans et al. ................. | 364/300 |
| 5,486,995 A | | 1/1996 | Krist et al. .................. | 364/149 |
| 5,644,688 A | * | 7/1997 | Leon et al. .................. | 395/120 |
| 5,680,590 A | | 10/1997 | Parti ........................... | 395/500 |
| 5,822,218 A | * | 10/1998 | Moosa et al. ................ | 364/488 |
| 5,859,964 A | | 1/1999 | Wang et al. ............ | 395/185.01 |
| 5,912,824 A | | 6/1999 | Sawahata .................... | 364/578 |
| 5,920,492 A | | 7/1999 | Montag et al. ............. | 364/578 |
| 5,977,551 A | | 11/1999 | Sawahata ................ | 250/492.21 |
| 6,108,006 A | | 8/2000 | Hoppe ......................... | 345/423 |
| 6,137,492 A | | 10/2000 | Hoppe ......................... | 345/420 |
| 6,144,929 A | | 11/2000 | Kumashiro .................... | 703/2 |
| 6,321,601 B1 | * | 11/2001 | Maris ........................... | 73/657 |

FOREIGN PATENT DOCUMENTS

| | | | | |
|---|---|---|---|---|
| JP | 9023002 A | 1/1997 | ........... | G06F/15/60 |
| JP | 10048162 A | 2/1998 | ......... | G01N/23/225 |
| WO | WO98/53307 | 11/1998 | | |

* cited by examiner

Primary Examiner—Samuel Broda
Assistant Examiner—Thai Phan
(74) Attorney, Agent, or Firm—Casey P. August; Jon A. Gibbons; Fleit, Kain, Gibbons, Gutman, Bongini & Bianco P.L.

(57) ABSTRACT

A method, computer readable medium and a structure for real-time simulation, which allows the user to manipulate model parameters and see the simulated result in real-time as the model is changed. The simulated result is visually compared with the data, allowing the user to refine the model. In one embodiment, the invention is used for evaluating medium energy ion scattering (MEIS) data, as well as conventional Rutherford backscattering data. It is important to realize that the invention is not limited to ion beam analysis, or to scientific data analysis. The invention can be used for evaluating any type of complex system where a well-defined simulation procedure exists. The model evaluation must proceed quickly enough to provide a real-time, visual display for the user.

18 Claims, 8 Drawing Sheets

REAL-TIME MODEL EVALUATION

PARTIAL WAIVER OF COPYRIGHT

All of the material in this patent application is subject to copyright protection under the copyright laws of the United States and of other countries. As of the first effective filing date of the present application, this material is protected as unpublished material. However, permission to copy this material is hereby granted to the extent that the copyright owner has no objection to the facsimile reproduction by anyone of the patent documentation or patent disclosure, as it appears in the United States Patent and Trademark Office patent file or records, but otherwise reserves all copyright rights whatsoever.

CROSS REFERENCE TO RELATED APPLICATIONS

Not Applicable

BACKGROUND OF THE INVENTION

1. Field of the Invention

This invention generally relates to the field of computer simulation, and more particularly to real-time modeling and based upon model parameters the results in real-time.

2. Description of the Related Art

Simulation of products or processes using a computer is well known. The products or processes being simulated may be very complex, expensive and involve a long time to build. Simulating how the product or process will perform and behave allows for minimizing time and money while helping to ensure an optimum solution. In addition certain attributes can be "accelerated" such as fail rates and assembly tolerances. Process may be very fast (e.g., nuclear reactions), slow (e.g., rate for oxidization), or dangerous (e.g., fire), hence simulating allows for an understanding of the final result in a reasonable amount of time. Additionally simulation as it reduces analysis time results in lowered labor cost, which is increasingly a major cost component in product or process designs.

Normal Simulation

Figure 1:
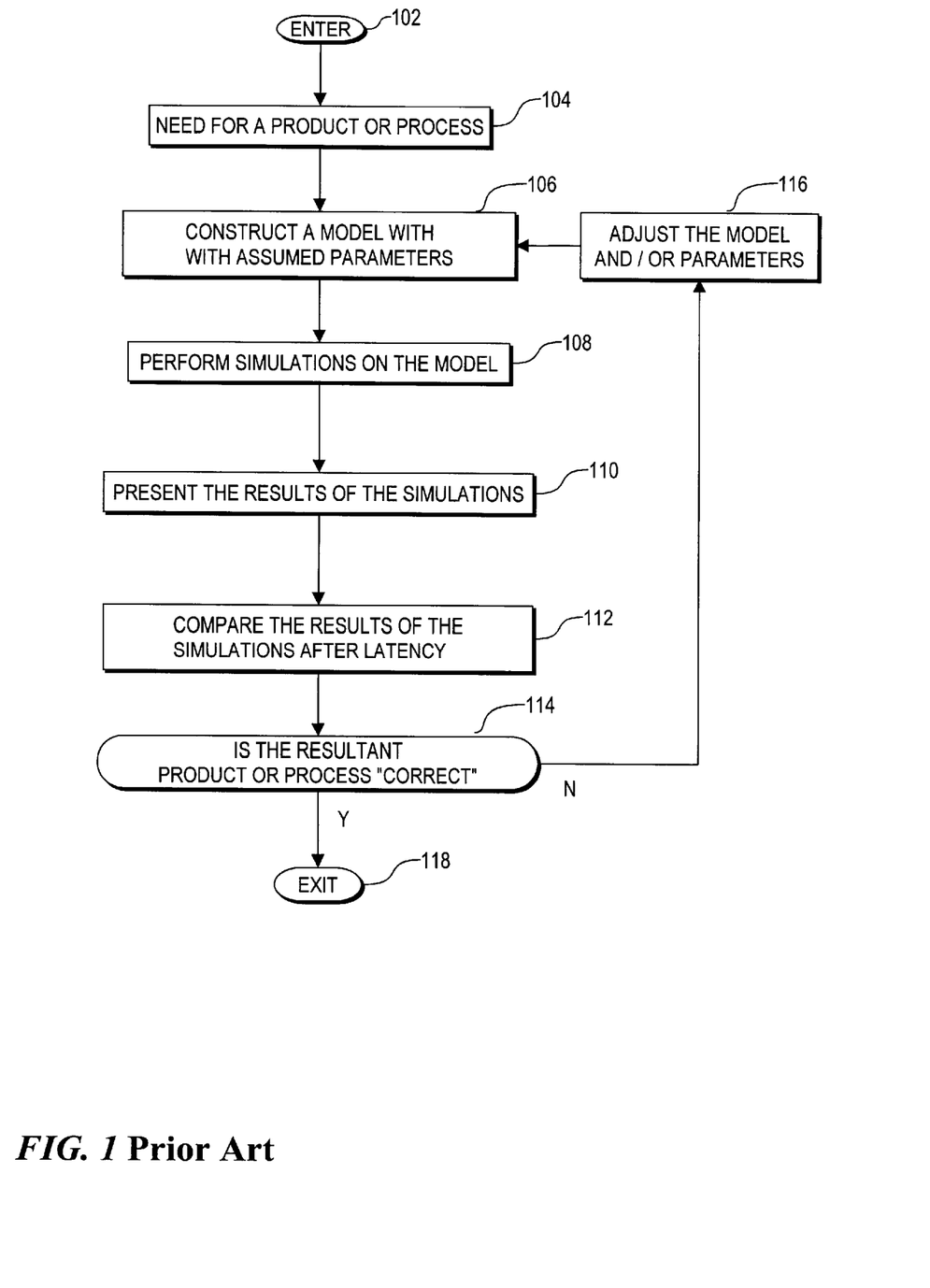
FIG. 1 is a flow diagram of a prior art manual simulation method.

Referring to FIG. 1, there is shown a flow diagram 100, which describes the prior art of a manual simulation technique. The flow is entered 102 when the need for a product or process is recognized 104. An obvious question is: why not just build it or try it and see what happens? As noted above, the reasons for simulation over cut-and-try designs are well known. Cost, time, safety, and developing an optimum product are but a few reasons. Therefore an empirical model is developed 106. The set of equations are based on a set of assumptions and usually are always being tuned and refined. Once the model is selected and programmed a simulation is performed 108. It is noted that in some cased the simulation is very simple and the computer that is used is a PC. While in other cases such as weather prediction the simulation is very complicated and the computer used may be a main frame or the latest array processor such as the IBM Power Parallel Series machine. In any case, once the simulation is completed the results are presented 110. The results may be as simple as a single number, say the time an airplane has to run out of fuel, or a very complicated "answer" such as the weather across the nation over a 24-hour period. Once the simulation is completed there is typically additional time required to present the simulation results in a meaningful way 112. Once the results are studied, they are typically compared 114 to what was expected or desired. If the results are considered to be "correct" the simulation is considered to be complete and the flow is exited 118. If the simulation is not deemed to be correct 114 the model and or the parameters are adjusted and an additional simulation run is performed 116. The intended change and magnitude of the changes to the model and its parameters are usually accomplished by someone skilled in the art of simulation and particularly of what is being simulated. This type of simulation flow 100 although useful is not without its shortcomings. One shortcoming is the need to visualizing results in real-time. Nevertheless the results as compared to the different parameters and the interaction thereof is sometimes difficult to visualize. If a given parameter is changed, what will happen? The dynamics of creative thinking, which is usually "real-time", is effected if the time to compare the results of the simulation with what is expected is too long. Accordingly, a need exits for real-time simulation and the display of the results, and adjustment to the modeling in such a way that the relationship between the model and the parameters are intuitive and real-time.

Simulation with Goodness of Fit by Computer

Figure 2:
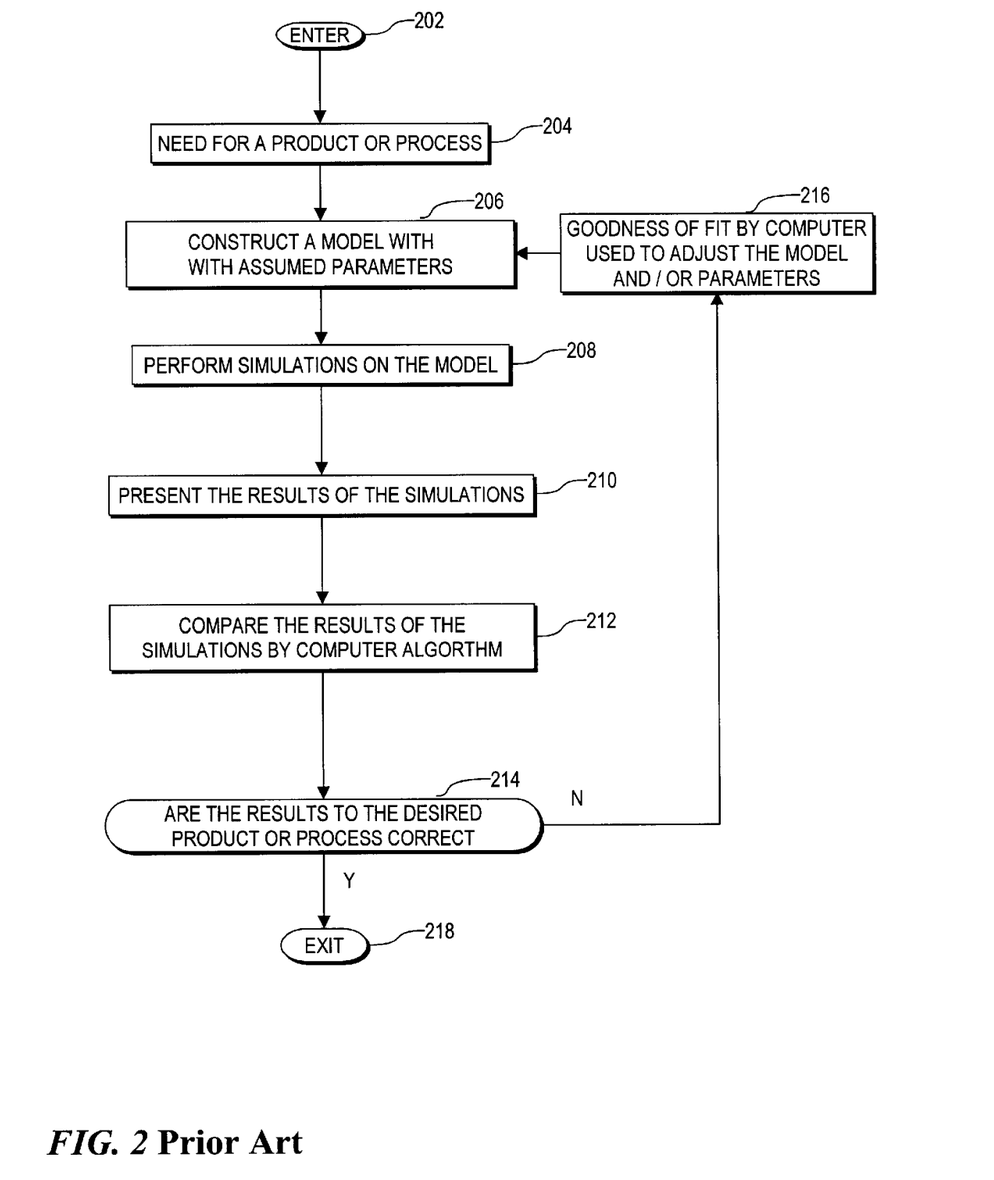
FIG. 2 is a prior art flow diagram of an automated simulation method using a computer.

Turning now to FIG. 2, flow diagram 200 illustrates the prior art of an automated simulation and optimization method using a computer. This flow differs from flow diagram 100 in that this is automated where a computer sets the process parameters in flow 200, the process flow in FIG. 1 is set manually. The flow is entered 202 with the need for a product or process 204. A model with assumed parameters is constructed, however unlike the previous simulation built into this model is a best direction for certain parameters, or a best answer. In an example, simulating fuel economy in an automobile, the best answer would be higher miles per gallon. Once constructed the simulation is performed 208. The results are presented 210, and these results are compared to what is desired 212. As a result of the comparison 214 the computer's simulation is deemed to be satisfactory and the flow is exited 218. Alternatively the comparison is not considered optimum and the computer simulation optimization method adjusts the model and I or the parameters so as to effect the "goodness of fit" 216 (i.e. how close the simulation worked) and a new simulation is performed 206 until the iterative simulation "homes in on" or "zeros in on" an optimum result.

This automated optimization method although useful has several shortcomings. One shortcoming is the skill required to program intelligence into the model is very high. The simulation must take into account all sorts of parameters, and know the parameters how the parameters effect the results. This approach is unsuccessful for many applications, since it is often difficult to define a proper "goodness-of-fit" parameter. Commonly this technique results in a computer emphasizing an unimportant region of the data that any skilled user would neglect. Typically there are trade-offs. Skilled users apply different "what if" scenarios to help further define a "goodness-of-fit" parameter. Returning to the simulating fuel economy, another parameter for simulating fuel economy may be the type of tire. Knowing when to stop trying is also a problem, as the price computer's simulation time can be high. Computers can also spend significant time trying to optimize a certain parameter when other parameters or parameter interaction will yield unintended results. For example, the color of the car should not matter in simulating fuel economy. Accordingly a need exists for an expert simulation technique that is based on the knowledge and experience of one skilled in the art of the product or process being simulated, without the need for skill in modeling and simulation techniques.

SUMMARY OF THE INVENTION

Briefly, according to the present invention, disclosed is a method, a system and computer readable medium for real-time simulation and user interface to enable real-time comparison to known good data as the model is changed for scientific and engineering solutions. Thus, the user is able to evaluate the aptness of the model in simulating the results.

This package includes two, tightly coupled programs. The first is called InSpec, which serves as the simulation engine. The engine reads the model parameters, generates a simulated result, and displays the simulation superimposed on the data. In order to provide visually satisfying results, the engine must operate quickly, generating a new simulation in less than a fraction of a second. A second program according to the present invention, called Layer, serves as the GUI. Layer provides a means for manipulating the model, transmitting it to the engine, and signaling the engine when to evaluate the model. In one embodiment, Layer has been used to evaluate ion backscattering experiments. In this embodiment, Layer enables the user to control the ion beam and detector parameters, as well as the sample structure including the number of layers, layer compositions and thickness.

BRIEF DESCRIPTION OF THE DRAWINGS

The subject matter, which is regarded as the invention, is particularly pointed out and distinctly claimed in the claims at the conclusion of the specification. The foregoing and other objects, features, and advantages of the invention will be apparent from the following detailed description taken in conjunction with the accompanying drawings.

DETAILED DESCRIPTION OF AN EMBODIMENT

It is important to note, that these embodiments are only examples of the many advantageous uses of the innovative teachings herein. In general, statements made in the specification of the present application do not necessarily limit any of the various claimed inventions. Moreover, some statements may apply to some inventive features but not to others. In general, unless otherwise indicated, singular elements may be in the plural and visa versa with no loss of generality.

In the drawing like numerals refer to like parts through several views.

Exemplary Computer System

Figure 3:
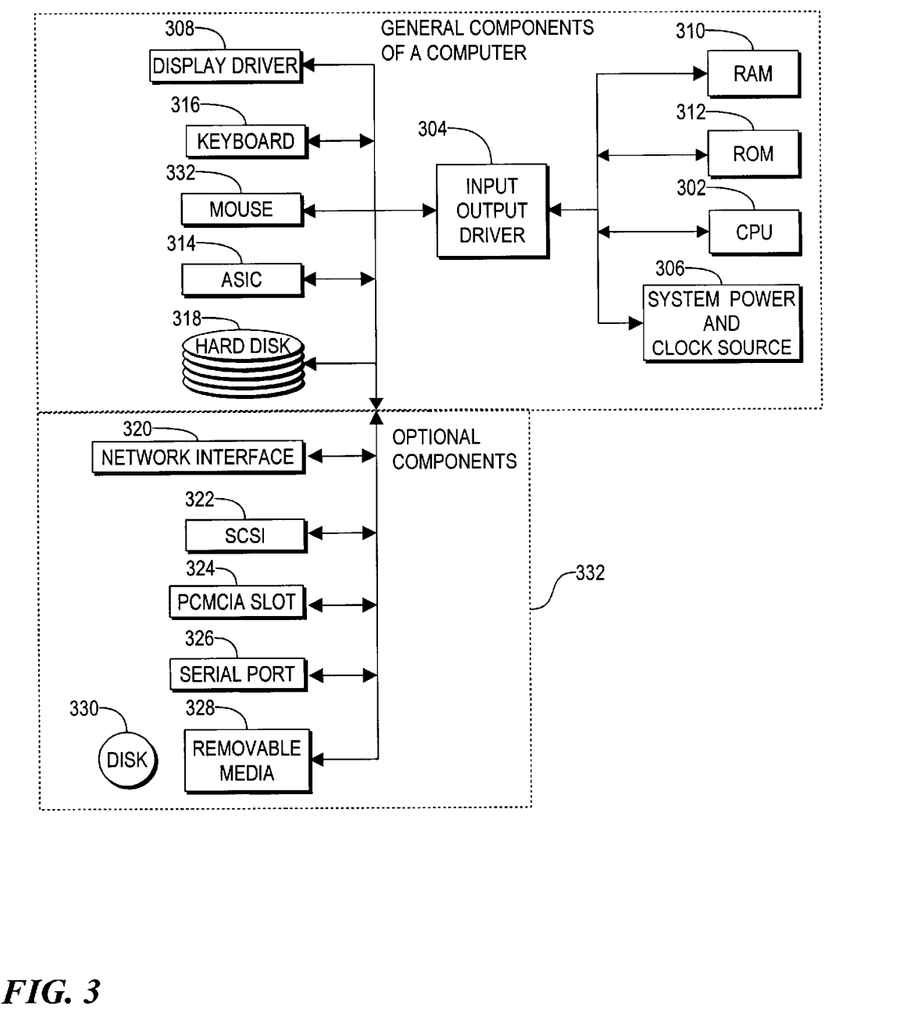
FIG. 3 is a block diagram of an exemplary computer system that includes optional components, upon which the present invention can be implemented.

Referring to FIG. 3, there is shown a block diagram 300 of the major electronic components of an information processing system 300 in accordance with the invention. The electronic components include: a central processing unit (CPU) 302, an Input/Output (I/O) Controller 304, a mouse 332 a keyboard 316, a system power and clock source 306; display driver 308; RAM 310, ROM 312, ASIC (application specific integrated circuit) 314 and a hard disk drive 318. These are representative components of a computer. The general operation of a computer comprising these elements is well understood. Network interface 320 provides connection to a computer network such as Ethernet over TCP/IP or other popular protocol network interfaces. Optional components for interfacing to external peripherals include: a Small Computer Systems Interface (SCSI) port 322 for attaching peripherals; a PCMCIA slot 324; and serial port 326. An optional diskette drive 328 is shown for loading or saving code to removable diskettes 330. The system 300 may be implemented by combination of hardware and software. Moreover, the functionality required for using the invention may be embodied in computer-readable media (such as 3.5 inch diskette 330) to be used in programming an information-processing apparatus (e.g., a personal computer) to perform in accordance with the invention.

Given this computer system, the typical Software Operating System and associated supporting applications can be installed which will simulate and display the results according to the present invention.

Exemplary Software Hierarchy

Figure 4:
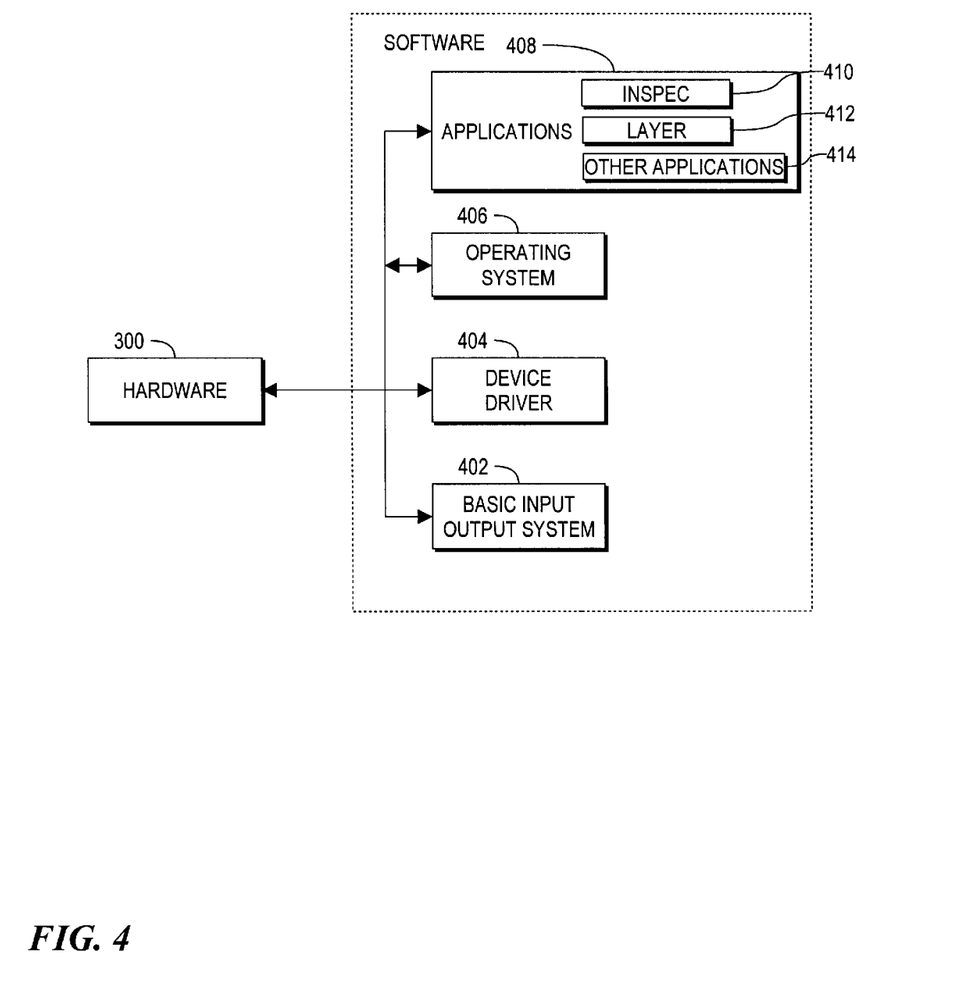
FIG. 4 is a block diagram of an exemplary software hierarchy that executed on the hardware of FIG. 3.

FIG. 4 is a block diagram 400, illustrating the software hierarchy for the information processing system 300 of FIG. 3 according to the present invention. The BIOS (Basic Input Output System) 402 is a set of low level of computer hardware instructions for communications between an operating system 406, device driver 404 and hardware 300. Device drivers 404 are hardware specific code used to communicate between and operating system 406 and hardware peripherals such as a CD ROM drive or printer. Applications 408 are software application programs written in C/C++, assembler or other programming languages. Operating system 406 is the master program that loads after BIOS 402 initializes, that controls and runs the hardware 400. Examples of operating systems include Windows 3.1/95/98/ME/2000/NT, Unix, Macintosh, OS/2, Sun Solaris and equivalents.

Applications 408 typically has several programs that are available for usage. Two such applications are InSpec 410 and Layer 412. Taken together these are preferred embodiments of the present invention. There are also other applications programs 414 that are also available. These applications may be such as word processors or spread sheet programs.

Discussion of Hardware and Software Implementation Options

The present invention as would be known to one of ordinary skill in the art could be produced in hardware or software, or in a combination of hardware and software. However in one embodiment the invention is implemented in software, particularly an application 406 of FIG. 4. The system, or method, according to the inventive principles as disclosed in connection with the preferred embodiment, may be produced in a single computer system having separate elements or means for performing the individual functions or steps described or claimed or one or more elements or means combining the performance of any of the functions or steps disclosed or claimed, or may be arranged in a distributed computer system, interconnected by any suitable means as would be known by one of ordinary skill in art.

According to the inventive principles as disclosed in connection with the preferred embodiment, the invention and the inventive principles are not limited to any particular kind of computer system but may be used with any general purpose computer, as would be known to one of ordinary skill in the art, arranged to perform the functions described and the method steps described. The operations of such a computer, as described above, may be according to a computer program contained on a medium for use in the operation or control of the computer, as would be known to one of ordinary skill in the art. The computer medium, which may be used to hold or contain the computer program product, may be a fixture of the computer such as an embedded memory or may be on a transportable medium such as a disk, as would be known to one of ordinary skill in the art.

The invention is not limited to any particular computer program or logic or language, or instruction but may be practiced with any such suitable program, logic or language, or instructions as would be known to one of ordinary skill in the art. Without limiting the principles of the disclosed invention any such computing system can include, inter alia, at least a computer readable medium allowing a computer to read data, instructions, messages or message packets, and other computer readable information from the computer readable medium. The computer readable medium may include non-volatile memory, such as ROM, Flash memory, floppy disk, Disk drive memory, CD-ROM, and other permanent storage. Additionally, a computer readable medium may include, for example, volatile storage such as RAM, buffers, cache memory, and network circuits.

Furthermore, the computer readable medium may include computer readable information in a transitory state medium such as a network link and/or a network interface, including a wired network or a wireless network, that allow a computer to read such computer readable information.

Software Overview

The present invention is a package of computer programs that will allow the user to manipulate model parameters and see the simulated result simultaneously, as the model is changed. The simulated result is visually compared with the measured data, allowing the user to refine the model. Thus, the user is able to evaluate the aptness of the model in describing the results, and to predict alternate variations.

In one embodiment, the present invention is used to assist in evaluating ion backscattering experiments. The preferred embodiment consists of two, tightly coupled programs. One program, called InSpec, serves as the simulation engine. The engine must read the model parameters, generate a simulated result, and display the simulation superimposed on the data. In order to provide visually satisfying results, the engine must operate quickly, generating a new simulation in what seems to be real-time. A second program according to the present invention, called Layer, serves as the GUI. Layer provides a means for manipulating the model, transmitting user input to the engine, and signaling the engine when to evaluate the model. Layer allows the user to control the ion beam and detector parameters, as well as the sample structure (layer compositions and thicknesses). A more detailed description follows.

InSpec is based on a C port of a Fortran continuum model of ion beam/solid interactions. It uses a slab calculation, propagating the ion beam through layers of the sample and calculating the contribution of each slab to the final spectrum. The C code is interfaced to Windows95, and uses Windows95 graphics and messaging. A model consisting of several distinct layers, of arbitrary composition and thickness can be evaluated in well under a fraction of a second. The data is read once during program initialization, and can be reinitialized by the user. The program is compiled with the IBM Visualage C++ compiler.

Layer in accordance with one embodiment of the present invention is written in Microsoft Visual Basic. Layer in one embodiment is used to evaluate ion beam backscattering. The user has a choice of panels to describe beam parameters (ion species, energy, detector angle, etc.), sample species, and layer composition. The layer compositions define stoichiometry and thickness, by either graphical sliders manipulated by a pointing device such as a mouse 332 or keyboard input 316. Layer also defines a cycle time, which is the frequency that the model will be updated. The cycle time typically is a small fraction of a second. Typically, the user defines the beam parameters by keyboard input. Next, the user adjusts the layer compositions by moving the graphical sliders 316 until there is good agreement with the data. Specifically if one is adjusting a slide bar of a parameter using Layer, the plot of the known good data with the over lay of the simulation data is seen to be moving in direct response to the slid bar movement, and towards a good match. It is noted that the slide bar is but one of several intuitive interfaces. Other interfaces, such a knob that is twisted, and push buttons that are labeled with particular values, may also be used. The model is then stored for future reference. An experienced user can fit a complex spectrum of an unfamiliar sample in several minutes.

Although the present invention has been described and used successfully for evaluating medium energy ion scattering (MEIS) data, as well as conventional Rutherford backscattering data, it is important to realize that the invention is not limited to ion beam analysis, or to scientific data analysis. The invention can be used for evaluating any type of complex system where a well-defined simulation procedure exists. The model evaluation must proceed quickly enough to provide a real-time, visual display for the user.

Layer GUI Interface for InSpec Simulation Program: Beam Panel

Figure 5:
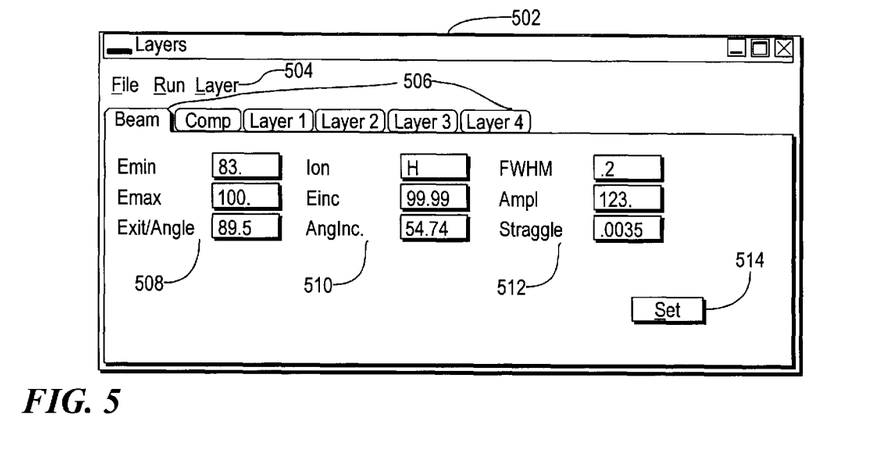
FIG. 5 is a screen shot of the Layer GUI (Graphical User Interface) that is used to model the beam characteristics of the simulated ion beam source.

Turning now to FIG. 5 illustrated is a GUI window 500 for the control of the simulation program InSpec, according to the present invention. It is noted that the window is not full screen and as will be developed, below is meant to be co-terminus with another window displaying the results of the simulation. A typical partial window 502 is shown within which a pull down menu 504 provides the typical File and Run selections. Below the selection menu 504 are several panels 506 which are the topics of "Beam", "Comp", and "Layer1" through "Layer4".

Given the selection of the Beam panel the parameters 508 are defined as follows:

| | |
|---|---|
| Emin minimum energy in spectrum: | set to 83. |
| Emax maximum energy in spectrum: | set to 100. |
| ExitAngle detector scattering angle: | set to 89.5 |

The next set of parameters 510 are defined as follows:

| | |
|---|---|
| Ion is the species in ion beam | set to H |
| Einc is the incident energy of ion beam | set to 99.99 |
| AngInc is the Angle of incidence of ion beam | set to 54.74 |

The next and final set of parameters 512 are defined as follows:

| | |
|---|---|
| FWHM is the detector resolution (full width half max) | set to 2 |
| Ampl Amplitude of the dosage | set to 123 |
| Straggle is the rate of increase of energy spread of ion beam | set to .0035 |

Note that these parameters are relatively static and are entered by a keyboard.

Finally the Set button 514 allows for the changes on the screen to be presented for simulation by transferring the values above to the simulation program InSpec.

Layer GUI Interface for InSpec Simulation Program: Comp Panel

Figure 6:
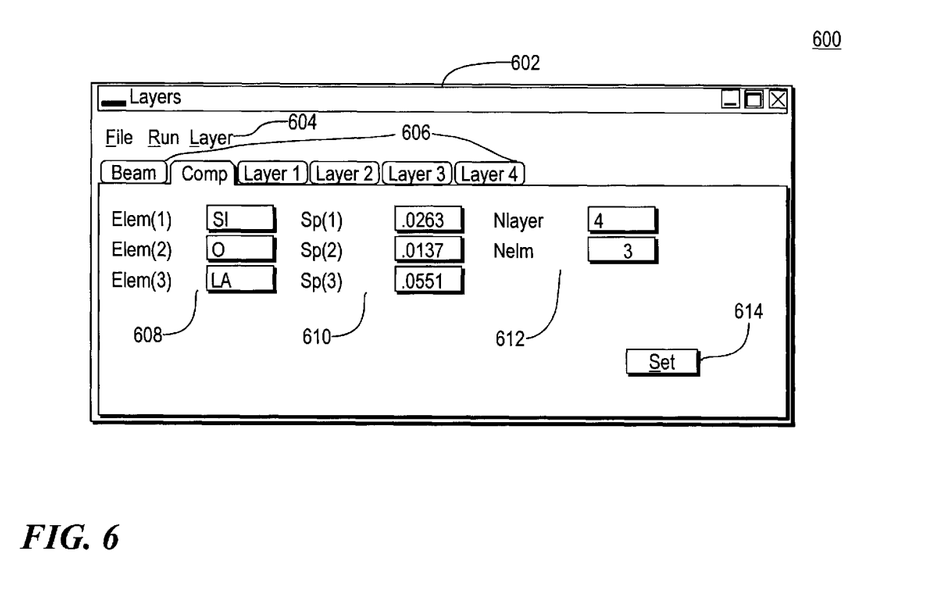
FIG. 6 is a screen shot of the Layer GUI that is used to model the composition of the layers that will be exposed to the ion beam source.

FIG. 6 is a GUI window 600 for the Comp panel of layer, which controls the simulation program according to the present invention. Comp is taken to be the composition of the given layers to be simulated.

A typical partial window 602 is shown within which pull down menus 604 provides the typical File and Run selections. Below the selection menu 604 are several panels 606 which are the topics of "Beam", "Comp", "Layer 1" through "Layer 4", and "Options". In this figure the Comp panel is selected 606 and these parameters are defined as follows:
The first set of parameters 608 are defined as:

| | |
|---|---|
| Elem(1) identity of 1st element in sample | set to SI that is Silicion |
| Elem(2) identity of 2nd element in sample | set to O that is Oxygen |
| Elem(3) identity of 3rd element in sample | set to LA that is Lanthium |

The second set of parameters 610 are defined as:

| | |
|---|---|
| Sp(1) stopping power (energy loss rate) of 1st element in sample | set to .0263 |
| Sp(2) stopping power (energy loss rate) of 2nd element in sample | set to .0137 |
| Sp(3) stopping power (energy loss rate) of 3rd element in sample | set to .0551 |

The final parameters 612 are defined as:

| | |
|---|---|
| Nlayer number of layers in sample | set to 4 |
| Nelm number of elements | set to 3 |

Note that FIG. 6 is not illustrating a different interface it is the same as FIG. 5. The difference is that the Comp panel is selected and not the Beam panel.

GUI Interface for InSpec Simulation Program: Layer 1

Figure 7:
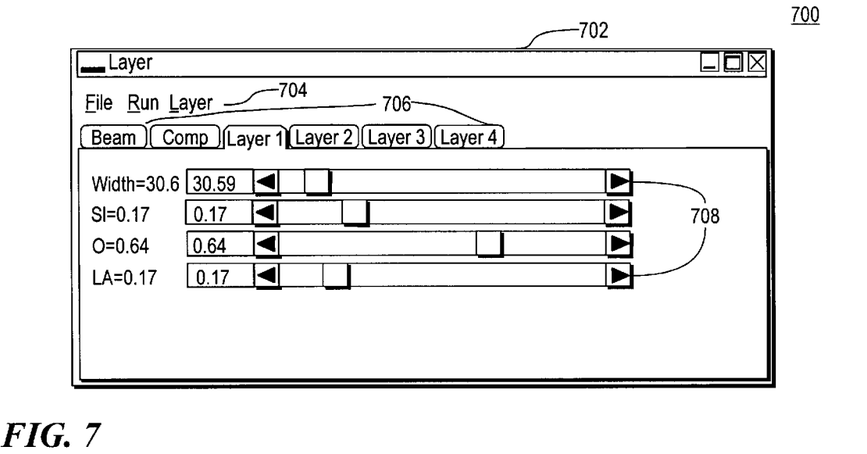
FIG. 7 is a screen shot of the Layer GUI that is used to model in real-time the effect of certain parameters of Layer 1.

Turning now to FIG. 7, shown is a GUI for the Layer 1 panel, which consists of the simulation program according to the present invention. It is noted that the window is not full screen. A typical partial window 702 is shown within which pull down menu 704 provides the typical File and Run selections. Below the selection menu 504 are several panels 706 which are the topics of "Beam", "Comp", "Layer 1" through "Layer 4", and "Options". In this figure the Layer 1 is selected and its operation is as follows:

Layer1

Si concentration of 1st elem. Varies between 0 and 1
O concentration of 2nd elem. Varies between 0 and 1
La concentration of 3rd elem. Varies between 0 and 1

It is noted that the selection of the values for the different parameters are controlled by the slider bars 708. With a pointing device all one needs is to select the slider and move to the right to up the selected values and to the left to reduce the value.

The balance of the layers 2 through 4 are similar to Layer 1 and are not shown here.

Plot of Simulation Results

Figure 8:
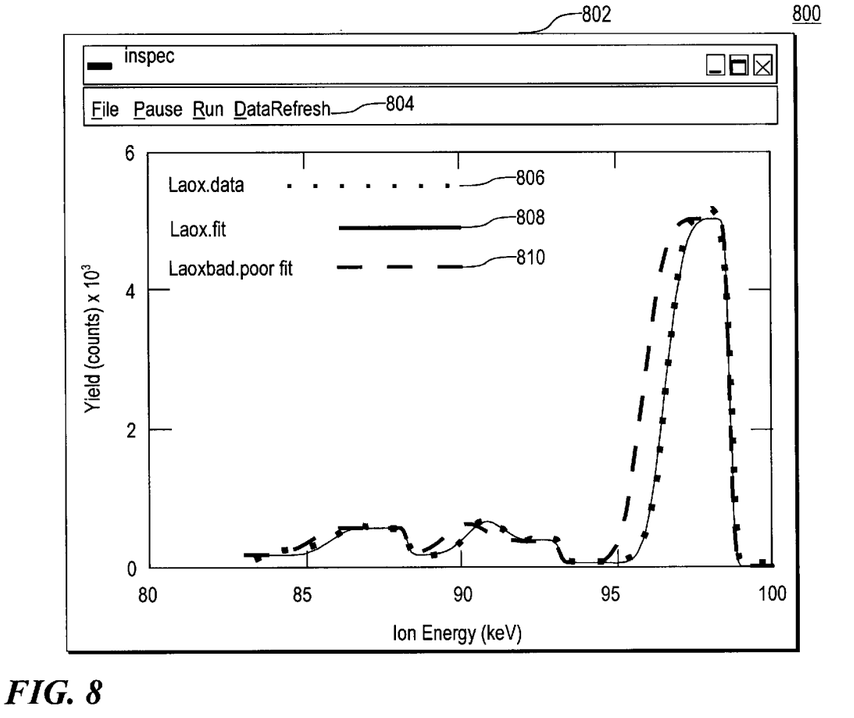
FIG. 8 is a screen shot of the plot that is presented by the program called InSpec which performs the simulation and plots known good data with simulation results for real-time comparison and modeling adjustments.
Figure 9:
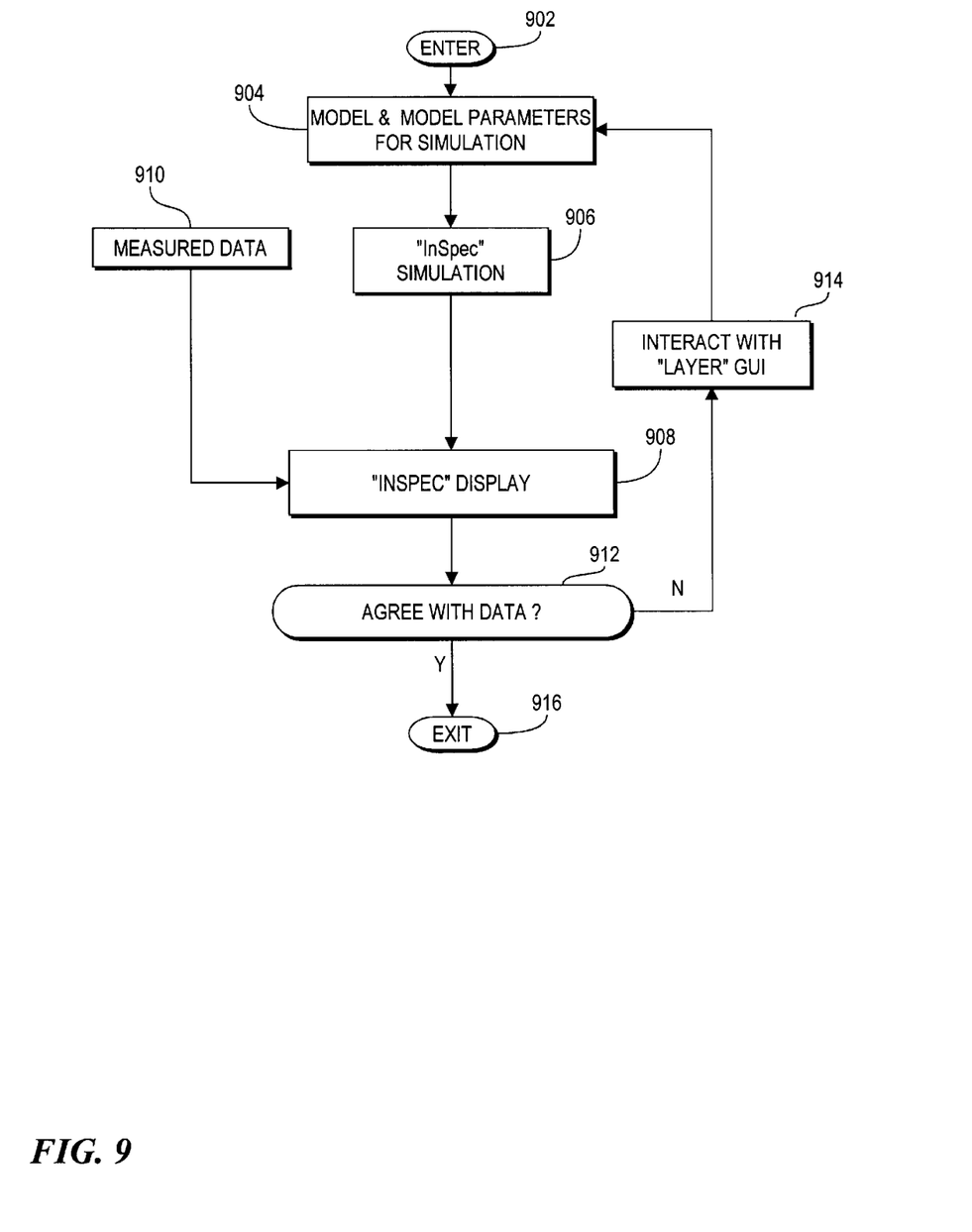
FIG. 9 is a flow diagram that shows simulation, viewing of the results and the interacting with the results in real-time.

Turning now to FIG. 8, illustrated is a plot 800 that is the result of simulation according to the present invention. It is noted that the window is not full screen. In this view a partial window 802 is shown within which pull the typical down menus 804 provide the File, Pause, Run and DataRefresh selections. The window shows three plots. The plot is of Yield vs. Ion Energy. The known good data Laox. data 806 is shown as the reference. Against this reference is shown a Laox.fit 808. The plot of the two is essentially a perfect match. However also shown is Laoxbad.fit Note that even for the un-skilled it is obvious that the Laox.fit 808 matches the Laox.data 806 better than the Laoxbad.fit 810.

The normal plotting of simulation results is well known in the art. However the simulation plots here are rendered on the same screen as the simulation parameters that are being used for simulation. In fact changes to the simulation parameters are reflected in the plots in real-time. For one skilled in the art, the slid bars can be moved and the results are shown in real-time on this graph of FIG. 8

It is important to note that the plot 800 of FIG. 8 along with the GUI control panel 700 of FIG. 7 are displayed at the same time. By having both plot 800 and control panel 700 displayed at the same time on a screen, the user can easily and in real-time manipulate a graphical control and see the result visualized simultaneously.

Flow Diagram According to the Present Invention

The flow diagram 900 according to the present invention is entered 902 with the need for the simulation of a product or process. The model and model parameters for simulation are selected and programmed with the interface of the InSpec program, as illustrated in FIGS. 5 through 7. The program then competes a simulation 906, and the results are displayed 908 on the same plot as the measured data 910. The results are viewed 912 and if the simulation plot is in agreement with the measured data the flow is exited 916. If there is disagreement 912 between the simulation results and the measured data, the simulation parameters are adjusted by interacting using the program Layer, using the intuitive slider bar GUI 708. After the parameters have been adjusted a new simulation is performed and the resultant plot is displayed. The time from the parameter adjustments to the plot of the results is in essentially real-time. The simulation is repeated until agreement with the data is achieved 912. That is, for one skilled in the art the movement of a particular slider bar to the left and to the right over time while watching the resultant plots as they change with respect to the data allows a quick optimization.

Details of InSpec and Layer

InSpec is a structured program, and is composed of subroutines, which are used internally to the program, and externally to access the operating system. Since performance and the perception of simultaneousness are particularly important, this program has been optimized for these essentials.

Internal Subroutines

The SPEC_INIT subroutine initializes variables, storage, and reads experimental data that will remain static during modeling. The SPEC_ULATE subroutine reads model parameters from a disk, then calls SPEC_COMP. SPEC_COMP composes the simulated spectrum, and is tuned to be efficient, for real time simulation.

The SPEC_COMP subroutine can be broken down into the following steps:

```
compute static variables (cross-section, trigonometric functions of
        experimental geometry)
divide each layer into sublayers, typically 200 per layer
loop over layers
    loop over sublayers
        propagate ion beam through sublayer
        loop over elements in sample
            calculate energy of ion backscattered from element
            convolve with detector response function (gaussian spread)
            add this intensity to computed spectrum
        endloop
    endloop
endloop
```

The final internal subroutine is PaintSpectrum which plots the data on the display, and plots the simulated spectrum, if one has been calculated.

The InSpec subroutine begins by calculating all static variables, such as trigonometric functions of the various scattering angles, scattering cross-sections, and scattering kinematic factors. In addition, the stopping powers of the various layers are calculated from the elemental stopping powers, which are provided as user input. The subprogram divides the layers into sub-layers, and propagates the beam through the sub-layers. As each sub-layer is encountered, the beam energy is decremented by the incident stopping power of the sub-layer. In addition, the energy broadening of the beam, also known as the straggling, is incremented. For a first approximation this program uses a single straggling value that is employed for all the layers, regardless of composition. For each element contained in the sub-layer, the backscatter and intensity energy is calculated. Finally, in the most heavily trafficked section of code, the intensity is spread over the spectrum using a gaussian function with a width that combines the detector resolution with the straggling.

External Subroutines

There are three external subroutines. The first is RUN, which calls SPEC_ULATE, and then calls PaintSpectrum as described above. The second is REFRESH, which calls SPEC_INIT, then calls PaintSpectrum. The final external subroutine is LAYER. Layer is not a part of InSpec, but a separate program written in Microsoft Visual Basic. Layer contains a timer object, which runs continuously and monitors user input. The program contains 3 major objects, BEAM, COMP, and SLAB, which are written as visual basic user controls. If the user has changed the model parameters, the timer object writes to disk and notifies InSpec.

The object BEAM corresponds to the beam panel, and was described in FIG. 5 above. It contains all the textboxes for BEAM parameters. The parameter Beam.isnew is a Boolean expression, which is used to tell whether this has been updated since the last time it was read. The parameter methods controls beam.SetBeam, which transfers model parameters into BEAM, and beam.GetBeam transfers model parameters out of BEAM.

The object COMP corresponds to the composition panel, and was described in FIG. 6 above. This object contains several methods, the first one being comp.isnew, which is a Boolean expression that is used to tell whether the parameter has been updated since the last time it was read. A second parameter is comp.nelm, which contains how many elements are in sample. A third parameter is comp.nlay, which contains how many layers are in sample.

In addition the object COMP contains two methods. comp.GetComp transfers element names and stopping powers out of BEAM. comp.SetComp transfers element names and stopping powers into BEAM.

Figure 10:
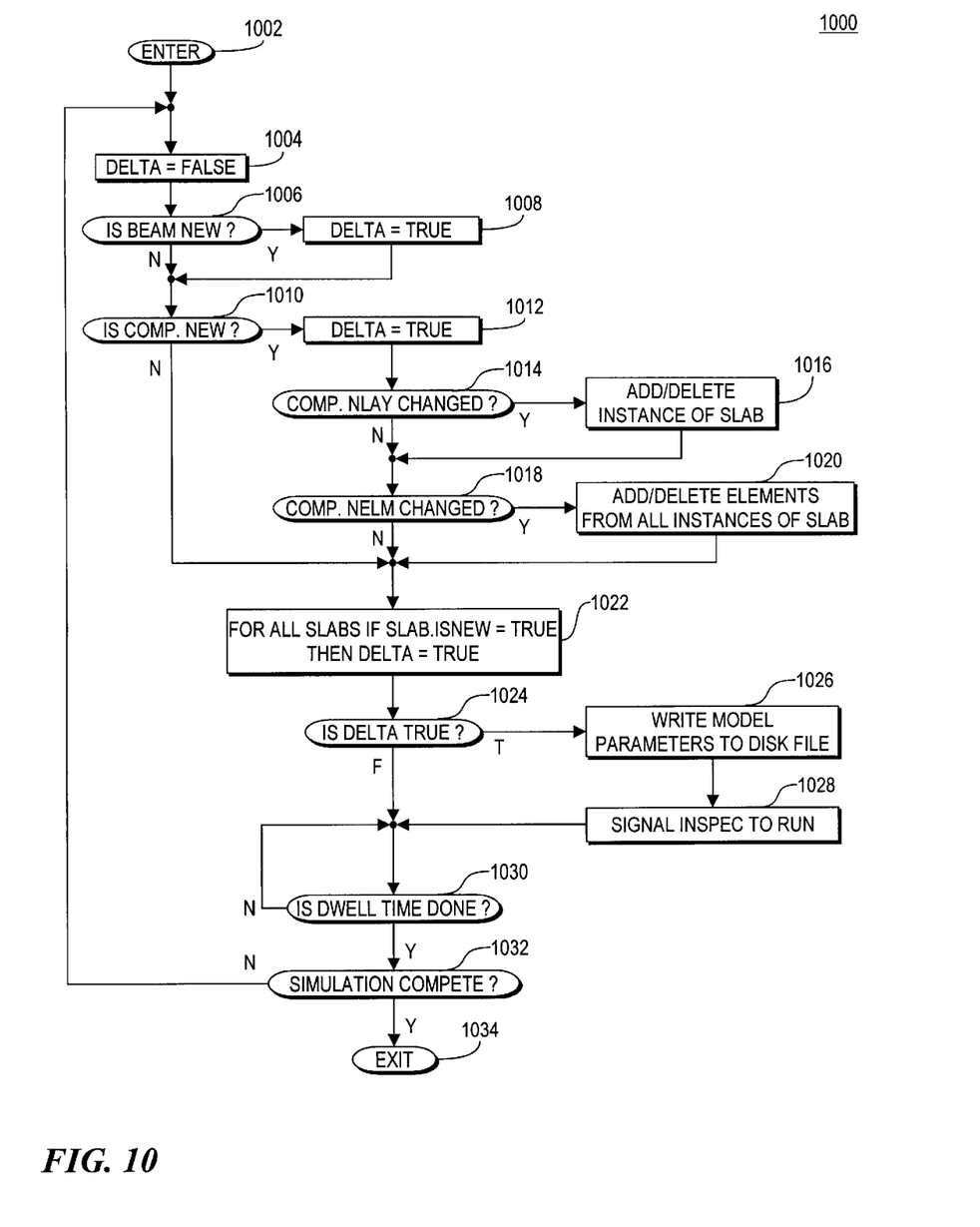
FIG. 10 is a detailed time driven flow diagram for the program called Layer.

The final object SLAB corresponds to a each layer of the sample. Multiple instances of SLAB are created, each corresponding to an individual layer of the sample. SLAB contains the sliders for thickness and concentration of elements in the layer, and was described in FIG. 7 above. There is an array of slabs, referred to by index, i. Where i, is the number of layers.

properties:
    slab(i).isnew same as above
    slab(i).thickness layer thickness
    slab(i).nelm how many elements are in slab
    slab(i).GetComp transfers element concentrations out of slab
    slab(i).SetComp transfers element concentrations into slab
    slab(i).SetElem transfers names of elements into slab
Layer Descripton Turning now to a description FIG. 10 which illustrates a flow diagram 1000 containing the operations for the program "Layer". The flow is entered 1002 when a simulation is being performed. Delta=FALSE 1004 causes a look up to determine if any of the simulation parameters have been changed. The first check is of the BEAM object, to see if it is new 1006. If BEAM is new, then DELTA is set to True 1008. After which COMP is checked 1010, to see if COMP is new. If COMP is new then the DELTA is set to TRUE 1012. Next a determination is made as to if the numbers of layers have changed 1014. If the number of layers has been changed then the number of layers added or deleted 1016 are passed to the SLAB object, that is the number of instances of SLAB are altered to match the number of layers. Next a determination is made as to if the number of elements has changed 1018. If the number of elements has changed then the number of elements that have been added or deleted is passed to the SLAB object. Next the slab objects are checked to see if they have been changed, and if so then DELTA is set to TRUE 1022. If DELTA is true 1024 then the model parameters are written to a disk file 1026 and a message is sent to InSpec to run a simulation based on the new parameters 1028. Once the InSpect simulation is complete the results are presented (not shown), and the simulation run is complete 1028. Or if the delta was not true 1024, that is no parameters were changed, a check is made as to if the dwell time is complete 1030. If it is not then the loop pauses until the dwell time is reached. This dwell time is set to be perceived to be instantaneous to the user. If we keep the exit of this flow diagram in place it is needed. Pull this if it is correct and I will change FIG. 10) Once the simulation is complete a check is performed as to if additional simulation is required 1032. If there is none, then the flow is exited 1034. If the simulation is not complete the flow is re-entered by checking again if the delta is false 1004, the loop being re-entered.

In an alternate embodiment the simulation software InSpec is implemented using an interrupt driven method. The basic calculations are identical to the flow diagram described in FIG. 10 but what causes them to happen is not time based. In the description above the timing of the dwell is set so as to be perceived by the user to be instantaneous with respect to any new input. However using this alternate method the simulation is started by sensing any change to certain registers that have been affected by the GUI inputs or other input methods such as the keyboard, mouse or one of the communication ports. The simulation then is accomplished with no dwell time. However, most of the time the InSpec simulation software is idle waiting for new or changed input from the user.

Non-limiting Examples

Although a specific embodiment of the invention has been disclosed. It will be understood by those having skill in the art that changes can be made to this specific embodiment without departing from the spirit and scope of the invention. The scope of the invention is not to be restricted, therefore, to the specific embodiment, and it is intended that the appended claims cover any and all such applications, modifications, and embodiments within the scope of the present invention.

What is claimed is:

1. A method on an information processing platform for simulating a multi-layer process or product, the method comprising;
  receiving a series of measured data inputs;
  running a real-time simulation engine that accepts one or more parameter inputs and produces one or more outputs in response thereto;
  presenting on a GUI (graphical user interface) a first region representing of the one or more outputs of the real-time simulation engine along with a representation of the measured data inputs;
  presenting on the GUI a second region representing GUI controls to one or more parameters inputs into the real-time simulation engine;
  receiving one or more changes to the one or more parameter inputs to the real-time simulation engine; and
  presenting on the GUI in the first region the one or more outputs of the real-time simulation concurrently with the representation of the measured data input so that changes to the one or more parameter inputs results in one or more changes to the outputs in response thereto are presented simultaneously with the measured data;
  wherein the real-time simulation engine performs analysis in real-time by dividing each layer of a multi-layer product or process into a series of sublayers;
  wherein a particle energy spectral contribution of each of the sublayers in each layer is calculated; and
  wherein the particle energy spectral contribution of each of the sublayers is convolved with a detector response function and added to a computed particle energy spectrum for the multi-layer product or process.

2. The method according to claim 1, where in the GUI controls are selected from a group of GUI controls consisting of a GUI knob, a GUI radio button, a GUI slider and a GUI elevator bar.

3. The method according to claim 1, wherein the step of presenting on a GUI a first region representing of the one or more outputs of the real-time simulation engine along with a representation of the measured data inputs includes presenting at least a part of the spectrum of the measured data inputs.

4. The method according to claim 1, wherein the step of presenting on the GUI in the first region the one or more outputs of the real-time simulation concurrently with the representation of the measured data input includes presenting a spectrum of the measured data inputs.

5. The method according to claim 1, where in the measured data is medium energy ion scattering (MEIS) data.

6. The method according to claim 5, wherein the step of receiving one or more changes to the one or more parameter inputs to the simulation engine includes receiving parameters to control ion beam and detector parameters.

7. The method according to claim 6, wherein the step of receiving one or more changes to the one or more parameter inputs to the simulation engine includes receiving parameter inputs of sample species number of layers and each layer's composition.

8. The method according to claim 6, wherein the step of receiving one or more changes to the one or more parameter inputs of layer composition includes stoichiometry and thickness.

9. The method according to claim 5, wherein the step of presenting on a GUI a first region representing one or more outputs of the real-time simulation engine includes presenting a plot of yield versus ion energy.

10. A method on an information processing platform for simulating a multi-layer product or process, the method comprising;
  receiving a series of measured data inputs from a measurement system monitoring the product or process being simulated;
  displaying on a display a first graph representing the series of measure data inputs;
  running a simulation engine for simulating the product or process from which a series of measured data inputs from a measurement system are being received, the simulation engine receiving one or more input parameters and produces one or more output parameters that represents a response thereto;
  receiving one or more changes to the input parameters for the simulation engine;
  displaying a second graph on the display representing the outputs of the simulation engine concurrently with the first graph representing the series of measured data inputs from the product or process being simulated;
    wherein the real-time simulation engine performs analysis in real-time by dividing each layer of a multi-layer product or process into a series of sublayers;
    wherein a particle energy spectral contribution of each of the sublayers in each layer is calculated; and
    wherein the particle energy spectral contribution of each of the sublayers is convolved with a detector response function and added to a computed particle energy spectrum for the multi-layer product or process.

11. The method according to claim 10, wherein the step of displaying a second graph on the display representing the outputs of the simulation engine includes displaying the second graph so that when changes to the one or more input parameters are received, the second graph representing the outputs of the simulation engine changes as well.

12. A computer readable medium containing programming instructions for simulating a multi-layer process or product, the programming instructions comprising;
  receiving a series of measured data inputs;
  running a real-time simulation engine that accepts one or more parameter inputs and produces one or more outputs in response thereto;

presenting on a GUI (graphical user interface) a first region representing of the one or more outputs of the real-time simulation engine along with a representation of the measured data inputs;

presenting on the GUI a second region representing GUI controls to one or more parameters inputs into the real-time simulation engine;

receiving one or more changes to the one or more parameter inputs to the real-time simulation engine; and presenting on the GUI in the first region the one or more outputs of the real-time simulation concurrently with the representation of the measured data input so that changes to the one or more parameter inputs results in one or more changes to the outputs in response thereto are presented simultaneously with the measured data;

wherein the real-time simulation engine performs analysis in real-time by dividing each layer of a multi-layer product or process into a series of sublayers;

wherein a particle energy spectral contribution of each of the sublayers in each layer is calculated; and wherein the particle energy spectral contribution of each of the sublayers is convolved with a detector response function and added to a computed particle energy spectrum for the multi-layer product or process.

13. The computer readable medium according to claim 12, where in the GUI controls are selected from a group of GUI controls consisting of a GUI knob, a GUI radio button, a GUI slider and a GUI elevator bar.

14. The computer readable medium according to claim 12, wherein the programming instruction of presenting on a GUI a first region representing of the one or more outputs of the real-time simulation engine along with a representation of the measured data inputs includes presenting at least a part of the spectrum of the measured data inputs.

15. A computer readable medium containing programming instructions for simulating a multi-layer product or a process, the programming instructions comprising;

receiving a series of measured data inputs from a measurement system monitoring the product or process being simulated;

displaying on a display a first graph representing the series of measure data inputs;

running a simulation engine for simulating the product or process from which a series of measured data inputs from a measurement system are being received, the simulation engine receiving one or more input parameters and produces one or more output parameters that represents a response thereto;

receiving one or more changes to the input parameters for the simulation engine;

displaying a second graph on the display representing the outputs of the simulation engine concurrently with the first graph representing the series of measured data inputs from the product or process being simulated;

wherein the real-time simulation engine performs analysis in real-time by dividing each layer of a multi-layer product or process into a series of sublayers:

wherein a particle energy spectral contribution of each of the sublayers in each layer is calculated; and wherein the particle energy spectral contribution of each of the sublayers is convolved with a detector response function and added to a computed particle energy spectrum for the multi-layer product or process.

16. The computer readable medium according to claim 15, wherein the programming instruction of displaying a second graph on the display representing the outputs of the simulation engine includes displaying the a second graph so that when changes to the one or more input parameters are received, the second graph representing the outputs of the simulation engine changes as well.

17. An information processing system for simulating a multi-layer product or a process, the programming instructions comprising;

an input for receiving a series of measured data inputs from a measurement system monitoring the product or process being simulated;

a display interface for displaying on a display a first graph representing the series of measure data inputs;

a simulation engine for simulating the product or process from which a series of measured data inputs from a measurement system are being received, the simulation engine receiving one or more input parameters and produces one or more output parameters that represents a response thereto;

a keyboard and mouse interface for receiving one or more changes to the input parameters for the simulation engine; and means for displaying a second graph on the display representing the outputs of the simulation engine concurrently with the first graph representing the series of measured data inputs from the product or process being simulated;

wherein the real-time simulation engine performs analysis in real-time by dividing each layer of a multi-layer product or process into a series of sublayers;

wherein a particle energy spectral contribution of each of the sublayers in each layer is calculated; and wherein the particle energy spectral contribution of each of the sublayers is convolved with a detector response function and added to a computed particle energy spectrum for the multi-layer product or process.

18. The information processing system according to claim 17, wherein the means for displaying a second graph on the display representing the outputs of the simulation engine includes displaying the second graph so that when changes to the one or more input parameters are received, the second graph representing the outputs of the simulation engine changes as well.

* * * * *